United States Patent [19]

Brown

[11] 4,419,735

[45] Dec. 6, 1983

[54] SIGNAL SOURCE FOR COMPRESSOR ANALOG

[75] Inventor: Morton E. Brown, San Antonio, Tex.

[73] Assignee: Southern Gas Association, Dallas, Tex.

[21] Appl. No.: 246,288

[22] Filed: Mar. 23, 1981

[51] Int. Cl.[3] .......................... G06G 7/64; G06F 15/34; H03B 19/00

[52] U.S. Cl. .......................... 364/803; 331/18; 331/178; 364/607

[58] Field of Search .............. 364/803, 701, 703, 718; 331/17, 18, 178

[56] References Cited

U.S. PATENT DOCUMENTS

| | | | |
|---|---|---|---|
| 2,936,041 | 5/1960 | Sharp et al. | 181/206 |
| 2,951,638 | 9/1960 | Hughes et al. | 364/803 |
| 2,979,940 | 4/1961 | Damewood et al. | 73/659 |
| 2,997,124 | 8/1961 | Damewood et al. | 181/233 |
| 3,662,163 | 5/1972 | Miller et al. | 364/718 |
| 3,753,141 | 8/1973 | Van Elk et al. | 331/17 X |
| 4,001,726 | 1/1977 | Sandford, Jr. et al. | 331/178 |
| 4,061,973 | 12/1977 | Reimers et al. | 331/18 X |
| 4,346,352 | 8/1982 | Baetke | 331/178 |

*Primary Examiner*—Felix D. Gruber

*Attorney, Agent, or Firm*—Hubbard, Thurman, Turner & Tucker

[57] ABSTRACT

An improved driving signal source for an electrical analog of a reciprocating compressor generates a variable frequency sinusoidal output. The ratio between the electrical frequency used by the analog and the mechanical frequency of the modeled compressor is controlled by a ratio set switch. Upper and lower limits of the mechanical speed are operator determined, and the electrical output frequency is varied between the corresponding upper and lower electrical analog frequencies. The instantaneous output frequency of the improved source is displayed in terms of mechanical compressor speed. The ratio of electrical to mechanical frequency can be changed independently of the upper and lower mechanical speed settings.

5 Claims, 3 Drawing Figures

SIGNAL SOURCE FOR COMPRESSOR ANALOG

BACKGROUND OF THE INVENTION

The present invention relates generally to an electrical analog of a pumping system and more specifically to an improved crank shaft driving source to be used with a capacitive model of a reciprocating compressor.

Installation or modification of natural gas or other fluid distribution systems requires consideration of a number of factors before work is undertaken. Variations in loads, distribution paths, pipe sizes and compressor speeds all have effects on operation of the system as a whole. Compression waves created in the gas by the operation of reciprocating pumps and compressors are especially troublesome as resonances can be set up in the system. This acoustical resonance increases metal fatigue and shortens the life of joints, valves and other components of the system.

To assist in planning for the control of undesirable pulsation and vibration of compressor and pipeline systems, an electrical analog of all fluid transfer components can be created. Present electrical systems analogize current to mass flow of the gas and voltage to pressure. Inductors, capacitors and resistors are used to model the mechanical properties of pipes and other components in the distribution system. A detailed model of a distribution system or subsystem can be set up and studied to predict the effects caused by changing various parameters in the operation of the distribution system. Examples of the use of gas pumping system analogs are found in U.S. Pat. Nos. 2,951,638 and 2,979,940.

In order to utilize easily obtained components, the operating frequency of the electrical analog is typically substantially higher than that of the mechanical system. An electrical to mechanical frequency ratio describes this relationship. Component values and analog system parameters are chosen so that all events which occur during the operation of the analog reflect events which will take place in the mechanical system. For example, the presence of an electrical resonance in the analog system at a certain frequency corresponds to a mechanical resonance at the corresponding mechanical speed.

One model of a reciprocating compressor or pump includes a capacitor which is driven by an AC voltage source. The signal source models the mechanical input, usually an electric motor or internal combustion engine, used to drive the compressor. Present signal sources used with reciprocating pump analogs are simple variable frequency sinusoidal oscillators.

It is desirable to test the reactions of a proposed or existing compressor or pumping system to various compressor speeds. This is accomplished by changing the driving oscillator frequency in the electrical analog of the pumps and compressors. For a given electrical to mechanical frequency ratio, the electrical frequency of the oscillator can be calculated for a desired mechanical frequency. One drawback of present systems is that a desired change in mechanical speed requires a recalculation of the electrical operating frequency.

A further drawback of present systems is that a change in the electrical to mechanical frequency ratio requires recalculation of all electrical operating frequencies corresponding to desired mechanical frequencies. It would be desirable to slowly vary the operating frequency of the analog compressors in order to study the effect of a range of compressor speeds on the system. Another drawback of present driving signal sources is that this cannot be accomplished.

SUMMARY OF THE INVENTION

It is therefore an object of the present invention to provide an improved analog crankshaft driver which does not required calculation of the necessary electrical operating frequency for a desired mechanical frequency.

It is a further object of the present invention to provide for automatic adjustment of the crankshaft driver analog frequency when the electrical to mechanical frequency ratio is changed.

It is another object of the present invention to provide a crankshaft driver analog with an output frequency which is variable over a predetermined range.

It is yet another object of the present invention that the upper and lower sweep limits of the driver analog can be set in terms of mechanical compressor speed.

According to the present invention, sinusoidal voltage controlled oscillator (VCO) provides the driving signal for a reciprocating compressor analog. A programmable frequency divider, controlled by a digital switch, comutes the mechanical compressor speed in RPM which corresponds to the operating frequency of the analog. This value is preferrable displayed.

The output of the VCO can be set to provide a constant frequency, or swept over a predetermined range. Output frequency variation is preferrably provided by controlling the VCO with a voltage determined by a bidirectional binary counter. Upper and lower limit comparators are coupled to the mechanical speed display device, and signal the counter when the mechanical output frequency of the analog reaches the upper and lower desired values, which are pre-set into limit switches. The counting rate of the binary counter determines the sweep rate of the VCO, so the sweep rate is controlled by varying the clock frequency of the binary counter.

The novel features which characterize the present invention are defined by the appended claims. The foregoing and other objects and advantages of the invention will hereinafter appear, and for purposes of illustration, but not of limitation, a preferred embodiment is shown in the accompanying drawings.

DETAILED DESCRIPTION OF THE PREFERRED EMBODIMENT

Figure 1:
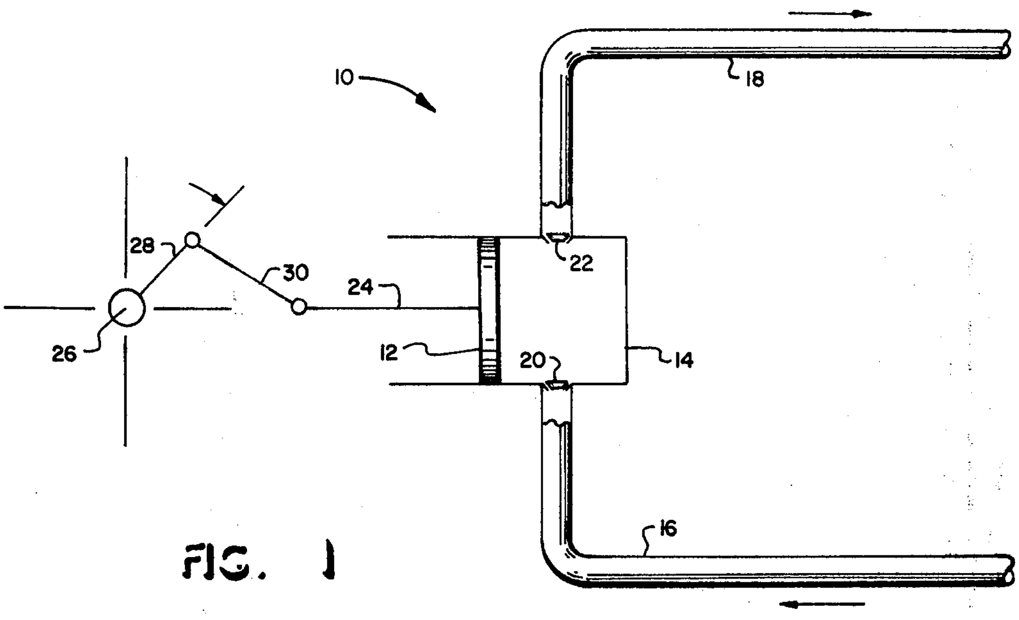
FIG. 1 is a schematic diagram of a single cylinder reciprocating compressor.

In FIG. 1, a schematic representation of a single cylinder reciprocating gas compressor is indicated generally by the reference numeral 10. Compressors used with gas distribution systems are usually comprised of plurality of compression cylinders arranged on a common crank shaft, but for discussion purposes, the electrical analog of only a single cylinder will be shown. It will become apparent to those skilled in the art that the improved signal source of the present invention can be used to drive an analog of a multicylinder compressor.

In the single cylinder compressor 10, a piston 12 reciprocates in a cylinder 14. An intake line 16 and a discharge line 18 are connected to the cylinder 14. A suction valve 20 and a discharge valve 22 control the flow of gases through the pipes 16, 18 and the cylinder 14. A piston rod 24 is fixed to the piston 12 and is connected to a power input shaft 26 through a crank 28 and a connecting rod 30. Movement of the piston 12 is caused by rotation of the crankshaft 26.

The input shaft 26 is coupled to a prime mover (not shown) such as an internal combustion engine or electric motor. As the prime mover rotates the shaft 26, the piston 12 alternately draws gas at a relatively low pressure into the cylinder 14, and expels the gas at high pressure through the discharge valve 22. The movement of the piston 12 describes a sinusoid due to the rotation of the shaft 26.

When the piston 12 begins its downstroke, the pressure of the gas contained in the cylinder 14 drops due to expansion. High pressure gas in the discharge pipe 18 is prevented from reentering the cylinder 14 by the presence of the discharge valve 22, which is a one way valve. When the pressure of gas in the cylinder 14 decreases below the static pressure of the gas in the suction pipe 16, the intake valve 20 opens and gas enters the cylinder 14. When rotation of the shaft 26 causes the piston 12 to begin its upstroke, the pressure of the gas in the cylinder 14 will increase, which closes off the one way intake valve 20. Further movement of the piston 12 causes a fixed mass of gas to be trapped in the decreasing cylinder volume and raises its pressure. When the pressure of the gas within the cyliner 14 rises above that in the discharge line 18, the discharge valve 22 opens and the gas passes from the cylinder 14 into the discharge tube 18. When the piston 12 reverses and begins another downstroke, the discharge valve 22 will close once again.

Assuming adiabatic expansion and compression of the gas, the gas pressure within the cylinder 14 can be approximately described by a sinusoidal function when the valves are closed. This assumption has proved to be a suitable one.

Figure 2:
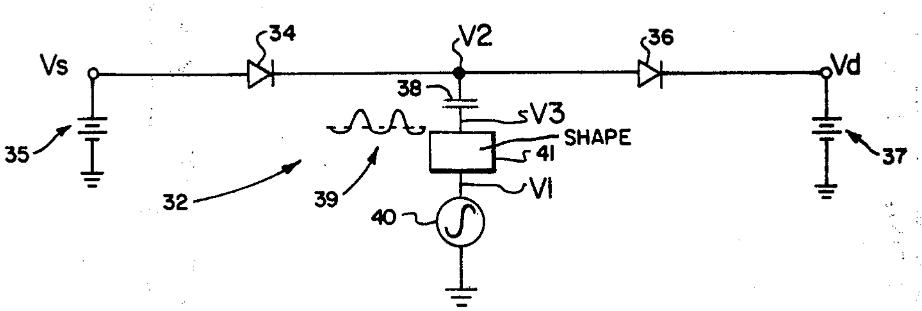
FIG. 2 is an electrical circuit analog of the compressor of FIG. 1.

Referring to FIG. 2, an electric circuit 32 which models the action of the reciprocating compressor 10 is shown. In this analog 32, electric current corresponds to gas flow and voltage corresponds to pressure. The electric currents and voltages are directly proportional to the mass flow and pressure of the gas, so that an increase in current or voltage corresponds to an increase in mass flow or pressure in the mechanical system.

In the electrical analog, a first diode 34 models the intake valve 20 of the compressor, and a second diode 36 models the discharge valve 22. A fixed voltage Vs, supplied by voltage source 35, models the static pressure of the gas in the intake piping 16. Voltage Vd, supplied by voltage source 37, represents the static pressure in the discharge pipe 18. When appropriately driven, a capacitor 38 models the cylinder 14 itself, while a suitable voltage source 40 models the prime mover mechanical input. To compensate for inaccuracies in the model caused by using a fixed capacitor to model a varying volume, driving signal input voltage V1 is shaped by appropriate circuitry 41, resulting in a shaped driving signal V3 being applied to the capacitor 38. The signal V3 can have a shape 39, for example.

Operation of the electrical analog 32 will be discussed in relation to the mechanical model of FIG. 1. The position of the piston 12 is modelled by the shaped voltage V3. That is, when the piston 12 has reached the top of the upstroke, the voltage signal V3 reaches its peak. The downstroke of the piston 12 corresponds to a falling voltage V3 and the upstroke of the piston 12 corresponds to a rising voltage V3. Again, because of the inaccuracies caused by the use of a fixed capacitor, the signal V3 has been shaped, so that the instantaneous value of V3 is not directly analogous to the position of the piston 12. However, the value of V3 and the position of the piston 12 are approximately corresponding.

A cylinder pressure voltage V2 models the pressure of the gas in the cylinder 14. The mass of gas in the cylinder is modelled by the electric charge on the capacitor 38. Changing capacitor charge caused by current flow through the diodes 34 and 36 corresponds to changes in the amount of gas present in the cylinder caused by flow through the valves 20 and 22. It will be appreciated that the voltage across the capacitor 38, which is the difference between voltages V3 and V2, varies directly with the charge on the capacitor 38, and remains constant when the capacitor charge is constant. Changes in the shaped driving voltage V3 while the capacitor charge is constant cause corresponding changes in the pressure voltage V2.

When the piston 12 begins its downstroke, the voltage V3 begins to fall from its peak value. At this point, the cylinder pressure voltage V2 is also at its peak value. As the shaped voltage V3 begins to fall, the cylinder voltage V2 also beings to fall. When the cylinder voltage V2 falls below the intake pressure voltage Vs, the intake diode 34 will be turned on, which is analogous to the intake valve 20 opening. It will be appreciated that a small forward bias voltage appears across the diode 34, but this voltage will be ignored for the purposes of this discussion.

As the cylinder voltage V2 begins to drop below the suction voltage Vs, current flow through the intake diode 34 and charges the capacitor 38. The capacitor 38 is charged at a rate which causes the pressure voltage V2 to remain constant, and substantially equal to the intake pressure voltage Vs. The second, or discharge diode 36, is reverse biased since the discharge voltage Vd is higher than the cylinder voltage Vs, so that no current flows through the discharge diode 36. When the piston 12 reaches the bottom of its downstroke, the signal voltage V3 reaches its minimum value. As the piston 12 begins the upstroke, the signal voltage V3 begins to rise. The current which has passed through the intake diode 34 has charged the capacitor 38, causing a voltage to appear across it. As the signal voltage V3 rises, the cylinder voltage V2 rises also.

When the cylinder voltage V2 begins to rise, the intake diode 34 becomes reverse biased and ceases to conduct current. At this point, the charge on the capacitor 38 remains fixed. This corresponds to the mass of gas trapped in the cylinder 14 remaining fixed. When the cylinder pressure voltage V2 increases beyond the static discharge voltage Vd, the discharge diode 36 becomes forward biased and conducts current. This corresponds to the pressure in the cylinder 14 increasing above that in the discharge pipe 18.

As the voltage V3 continues to increase, current flows from the capacitor 38 through the discharge diode 36. It will be appreciated that the cylinder voltage V2 cannot rise above the discharge voltage Vd by an amount greater than the forward bias voltage of the second diode 38.

When the piston 12 reaches the peak of its upstroke, the signal voltage V3 reaches its maximum and current ceases to flow through the discharge diode 38. As the piston 12 begins its next downstroke, the voltage V2 begins to drop, causing the discharge diode 38 to become reverse biased. The cycle, as described above, is then repeated.

The capacitor 38 in combination with the driving signal 40 operates as a charge pump to transfer charge from a lower voltage to a higher voltage. This action is analogous to the manner in which the compressor 10 transfers gas from a lower to a higher pressure.

Variations in the electrical model of a reciprocating compressor 10 are known in the art. However, the operation of all analogs utilizing a pumped capacitor 38 as a model for the compressor cylinder 14 also utilize a sinusoidal driving source 40 as discussed above. The present invention relates to an improvement in the apparatus for generating the compressor cylinder analog driving voltage V1, and may be used with numerous compressor models.

Figure 3:
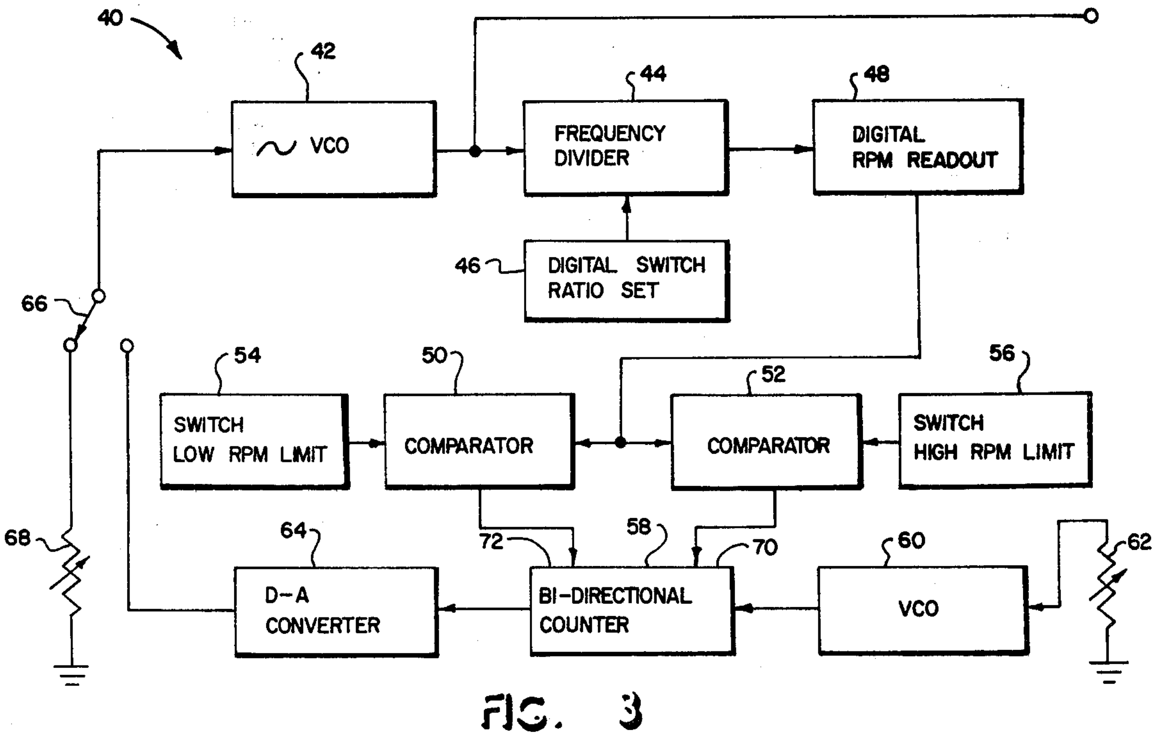
FIG. 3 is a block diagram of an improved signal driver for an electrical compressor analog.

Referring to FIG. 3, a block diagram of an improved driving signal source 40 is shown. The sinusoidal output of a first voltage controlled oscillator (VCO) 42 provides the driving signal V1. The output V1 of the first voltage control oscillator 42 is also coupled to a frequency divider 44. A control input to the frequency divider 44 is coupled to a digital switch 46. The output of the digital switch 46 is proportional to the electrical to mechanical frequency ratio.

The operating frequency of the electrical analog 32 is generally chosen to be substantially higher than that of the mechanical system which is being modelled. A low electrical frequency would require the use of extremely large capacitive and inductive components to model the mechanical system. The higher frequency of the electrical analog 32 allows the use of smaller, and thus cheaper and easier to obtain, components. A typical ratio as set by the switch 46 would be 1000. For example, if the compressor is running at 600 RPM, or 10 cycles per second, the electrical analog 32 of the compressor 10 will operate at 10 KHz.

The output frequency divider 44 represents the mechanical speed of the compressor 10. In the example of the previous paragraph, the switch 46 would control the frequency divider 44 so that an input frequency of 10 KHz gives a divider output of 600 Hz, which is the same value as the compressor speed in RPM. A digital frequency meter 48 detects and displays the output frequency of the divider 44. Proper setting of the frequency divider 44 causes the display to read the compressor speed directly in RPM.

The output frequency information from the display 48 is coupled to a low comparator 50 and a high comparator 52. A low RPM limit switch 54 is coupled to the low comparator 50, and a high limit switch 56 is coupled to the high comparator 52. Both comparator outputs are coupled to an up-down binary counter 58. The clock input of the binary counter 58 is provided by a second VCO 60. The frequency of the VCO 60 is controlled by a variable resistor 62. The output from the binary counter is coupled to a digital to analog (DA) converter 64. The output from the converter 64 is coupled to the sinusoidal VCO 42 through a two position switch 66. An adjustable voltage source represented by a second variable resistor 68 is also coupled to the input of the sinusoidal VCO 42 through the switch 66.

The crankshaft driver analog 32 may be operated in one of two modes. The first is a constant speed mode, which is selected by moving the switch 66 to the left as shown in FIG. 3. The frequency of the sinusoidal VCO 42 is controlled by adjusting the variable resistor 68. The mechanical compressor speed corresponding to the operating frequency of the electrical analog 32 will be displayed on the digital read out 48 as discussed above. The variable resistor 68 can be adjusted until the desired operating speed in RPM is set in the electrical analog 32. The analog frequency ratio can be easily changed if desired by resetting the digital switch 46.

The second operating mode of the crank shaft driver 32 is selected by moving the switch 66 to the right so that the output of the D-A converter is coupled to the sinusoidal VCO 42. In this mode, the operating frequency is continuously swept between upper and lower limits as selected in the limit switches 54, 56. The output of the binary counter 58 changes by one increment each time a clocking signal is received from the sweep VCO 60. The output frequency of this VCO 60 is controlled by the sweep rate variable resistor 62.

The binary counter 58 is an up-down binary counter which counts in a direction controlled by first and second inputs 70 and 72. If a proper signal is detected by the first input 70, the counter 58 will begin counting down. If a proper signal is received by the second input 72, the counter 58 will count up.

When the counter 58 is counting up, the frequency of the sinusoidal VCO 42, and therefore the mechanical frequency displayed by the digital output 48 will be gradually increasing at a rate determined by the sweep rate resistor 62. The highest desired mechanical speed has been previously set into the high RPM limit switch 56. When the operating RPM of the analog 32 reaches the value set in the high limit switch 56, the high comparator 52 generates a signal which is coupled to the first input 70 of the counter 58. This signal causes the counter 58 to begin counting down.

When the counter 58 counts low enough so that the mechanical analog frequency reaches that set in the low limit switch 54, the low comparator 50 generates a signal which is coupled to the second counter input 72, thereby causing the counter 58 to begin counting upward. Since the output value of the counter 58 controls the output frequency of the sinusoidal VCO 42 through the DA converter 64, it will be apparent that the operating speed of the crankshaft analog 32 will continuously sweep back and forth between upper and lower limits at a predetermined rate.

Although a preferred embodiment has been described in detail, it should be understood that various substitutions, alterations and modifications may become apparent to those skilled in the art. These changes may be made without departing from the spirit and scope of the invention as defined by the appended claims.

What is claimed is:

1. A signal source for an electrical model of a reciprocating fluid pump, comprising:

an oscillator having a controllable output frequency;

means for determining and displaying a mechanical system speed corresponding to the output frequency from said controllable oscillator, wherein the mechanical system speed differs from the oscillator output frequency by a predetermined ratio;

means for storing mechanical system upper and lower speeds;

comparison means for comparing the mechanical system speed to the mechanical system upper and lower speeds; and means for varying the output frequency of said oscillator so that the corresponding mechanical system speed changes between limits defined by the mechanical system upper and lower speeds.

2. The apparatus of claim 1 further comprising means for controlling the variation rate of the output frequency.

3. The apparatus of claim 1 further comprising means for adjusting the ratio between the mechanical system speed and the oscillator output frequency.

4. In an electrical analog of a fluid pump, said analog having a plurality of diodes and a capacitor, an improved driving source for modelling a power input device, said driving source comprising:

a first voltage controlled oscillator having a control input, and an output coupled to a capacitor of the electrical analog;

a programmable frequency divider coupled to the output of said voltage controlled oscillator and having a programming input;

a digital frequency meter coupled to the output of said frequency divider;

means coupled to the programming input of said frequency divider for controlling the ratio between the input and output frequencies of said frequency divider;

a second voltage controlled oscillator;

means for varying the output frequency of said second voltage controlled oscillator;

a bi-directional counter coupled to the output of said second voltage controlled oscillator so that the output of said counter changes one increment for each output cycle of said second voltage controlled oscillator;

a digital to analog converter coupled to the output of said bi-directional counter and having an output coupled to the control input of said first voltage controlled oscillator so that the output frequency of said first voltage controlled oscillator is a function of the output of said digital to analog converter;

high and low limit switches for setting the maximum and minimum desired output frequency of said frequency divider; and, comparator means for changing the direction of the incremental changes in the output of said bi-directional counter when the output of said frequency divider reaches the desired maximum and minimum frequencies.

5. The apparatus of claim 4 further comprising:

means for providing an adjustable DC voltage; and a switch coupled between said digital to analog converter output and the control input to said first voltage controlled oscillator, said switch operable so that either the DC voltage or the varying output from said digital to analog converter is applied to the input of said first voltage controlled oscillator.

* * * * *